United States Patent
Organ et al.

(10) Patent No.: US 7,047,463 B1
(45) Date of Patent: May 16, 2006

(54) METHOD AND SYSTEM FOR AUTOMATICALLY DETERMINING A TESTING ORDER WHEN EXECUTING A TEST FLOW

(75) Inventors: Donald V. Organ, Saratoga, CA (US); Richard C. Dokken, San Ramon, CA (US)

(73) Assignee: Inovys Corporation, Pleasanton, CA (US)

( * ) Notice: Subject to any disclaimer, the term of this patent is extended or adjusted under 35 U.S.C. 154(b) by 375 days.

(21) Appl. No.: 10/642,000

(22) Filed: Aug. 15, 2003

(51) Int. Cl.
*G01R 31/28* (2006.01)

(52) U.S. Cl. .................... 714/724; 714/51
(58) Field of Classification Search ............ 714/25, 714/733, 724, 33; 702/119; 709/238
See application file for complete search history.

(56) References Cited

U.S. PATENT DOCUMENTS

| | | | | |
|---|---|---|---|---|
| 5,537,653 A | * | 7/1996 | Bianchini, Jr. ............... | 714/25 |
| 5,657,256 A | * | 8/1997 | Swanson et al. ............. | 702/119 |
| 6,167,545 A | * | 12/2000 | Statovici et al. ............. | 714/724 |
| 6,275,861 B1 | * | 8/2001 | Chaudri et al. ............. | 709/238 |
| 6,367,041 B1 | * | 4/2002 | Statovici et al. ............ | 714/724 |
| 6,857,092 B1 | * | 2/2005 | Fox ............................ | 714/733 |

* cited by examiner

*Primary Examiner*—David Ton

(57) ABSTRACT

A method and system for automated multisite testing. Specifically, in one embodiment, a method is disclosed for determining a testing order of plurality of testing operations of a test flow in a multisite testing environment. The method begins by automatically walking through the test flow by performing recursion on the plurality of testing operations. Next, the method automatically assigns a plurality of relative priorities to the plurality of testing operations. The plurality of relative priorities determine the testing order used when executing each of the plurality of testing operations in said test flow. Each of the plurality of testing operations is executed only once when testing a plurality of devices under test (DUTs) in the multisite testing environment.

23 Claims, 10 Drawing Sheets

METHOD AND SYSTEM FOR AUTOMATICALLY DETERMINING A TESTING ORDER WHEN EXECUTING A TEST FLOW

BACKGROUND OF THE INVENTION

1. Field of the Invention

Embodiments of the present invention relate to the field of automated multisite testing. More particularly, embodiments of the present invention relate generally to reconverging test flow execution sub-paths in a test sequence. Other embodiments of the present invention relate generally to the assignment of priority values for testing operations in a test flow.

2. Related Art

Automatic Test Equipment (ATE) is used in the manufacture of semiconductor integrated circuits (IC chips), or dice on a wafer, to test the dice electrically to characterize the fabrication process, define operating parameters, and to ensure that they are free of manufacturing defects. Manufacturing costs of the dice are tied to the capital cost for the ATE as well as the operating cost of the ATE during testing of the dice. In particular, as the testing sequence executed by the ATE becomes longer, the operating cost of the ATE can be a significant portion of the cost of a single die. As such, reducing the operating cost of the ATE is of paramount importance.

Multisite testing is one approach to lessen the operating cost of ATE when testing integrated circuits. Testing efficiency is gained when multiple sites on an ATE perform the same operation simultaneously. In general, efficiency is gained when multiple sites on an ATE share the same testing resources on the ATE. On the other hand, efficiency is decreased when the devices at different sites on the ATE behave differently during test, forcing different sites to follow different execution paths through a test flow.

However, multisite testing in the prior art typically has been reduced to a single execution flow once devices at different sites on the ATE diverge during testing. In a single execution flow, multiple dice performing similarly are tested by executing numerous testing operations in a particular execution path. In multisite testing of the prior art, as long as the dice all perform similarly, then the efficiency is maintained, since the ATE can perform testing operations simultaneously on the dice. However, once dice behave differently, testing continues serially for the various groups of dice that behave differently.

In particular, for many IC chip designs, the flow associated with testing may have branching testing sequences. As such, the flow is comprised of numerous execution paths that a die may follow during test. Depending on which execution path is followed, various results may be attributed to the die. This is common in the case of "speed binning," for example, when an IC chip that operates at a high frequency can be separated out during testing and sold for a premium. Similarly, IC chips that fail at the higher frequency may be retested at a lower frequency through a separate execution path.

During multisite testing, it is usually not possible for the ATE to simultaneously test two different dice at different frequencies. In the prior art, dice that fail at the higher frequency are disabled during testing after a branch point, and testing continues for those dice that pass. Once testing terminates on the dice at the higher frequency, then the disabled dice that originally failed at the higher frequency are re-enabled, and testing continues at the lower frequency. In effect, the multisite testing of the prior art has been reduced to multiple single execution paths for the various dice that perform differently. In that case, the efficiencies of multisite testing are diminished since there is less simultaneous sharing of the ATE resources.

SUMMARY OF THE INVENTION

Accordingly, various embodiments of the present invention disclose a method and system for determining a testing sequence of a test flow. The testing sequence is used for execution of automated multisite testing of a plurality of devices under test (DUTs). This enables the simultaneous testing of the plurality of DUTs along various resultant execution paths, instead of testing individual devices one at a time along a single execution path.

Specifically, embodiments of the present invention describe a method and system for determining a testing order of plurality of testing operations of a test flow in a multisite testing environment. The method begins by automatically walking through the test flow by performing recursion on the plurality of testing operations. Next, the method automatically assigns a plurality of relative priorities to the plurality of testing operations. The plurality of relative priorities determine the testing order used when executing each of the plurality of testing operations in the test flow. Each of the plurality of testing operations is executed only once when testing a plurality of DUTs in the multisite testing environment.

More specifically, another embodiment describes a method of prioritizing testing operations in a test flow for use in a multisite testing environment. In one embodiment, the method of prioritizing testing operations begins by recursively processing, or walking through, the flow based on a pass priority. The test flow comprises a plurality of interrelated testing operations that are associated with a plurality of passing arcs and a plurality of failing arcs. Because of the pass priority, the flow is walked along passing arcs until reaching an end. At that point, the method returns to the most recent branch to walk the flow along the failing arc. Again, the method walks the test flow sequence based on a pass priority. The recursive walking through the flow continues until all the possible resultant test execution sub-paths of the test flow are recursively walked.

The method assigns priority values to each of the testing operations as the test flow is recursively walked. To begin, a priority value of "1" is given to the first testing operation that is visited when recursively walking through the test flow.

Thereafter, the method assigns a priority value to each of the testing operations each time a testing operation is visited while recursively walking the test flow. The assigned priority value is determined by incrementing the last assigned priority value by one.

The method then determines the testing order for the plurality of testing operations in the test flow. Each testing operation is associated with its highest assigned priority value. The test sequence is determined based on an inverse priority. As such, the lower the priority value, the higher its priority in the test sequence.

In another embodiment, a method is disclosed for simultaneously performing multisite testing of the DUTs by using the test sequence. During multisite testing, the testing operations are executed on the plurality of DUTs by order of priority in the test sequence. As such, testing operations in a test flow are performed once by order of priority on the plurality of DUTs. In this way, the test flow operations can be executed simultaneously on the greatest plurality of DUTs.

More particularly, the method allows for the divergence and reconvergence between two test execution sub-paths. In one embodiment, the method begins by simultaneously performing testing operations in a root test sequence on the plurality of DUTs. A branch occurs in the root test sequence when two different results are possible from a testing operation, that is a diverging testing operation. For example, some DUTs may pass the testing operation and others may fail the testing operation.

At the diverging testing operation, the method branches from the root test sequence to independently perform testing operations in a diverging test sequence on a first subset of the plurality of DUTs. For example, the first subset of the plurality of DUTs may have failed the diverging testing operation. A second subset of the plurality of DUTs may have passed the diverging testing operation.

After execution of the testing operations in the diverging test execution sub-path, the diverging test flow sequence is reconverged with the root test execution sub-path. In one embodiment, the method then continues performing testing operations in the root test execution sub-path simultaneously on those of the first subset passing the diverging test sequence and those of the second subset reaching the reconverging testing operation.

DETAILED DESCRIPTION OF THE INVENTION

Figure 1:
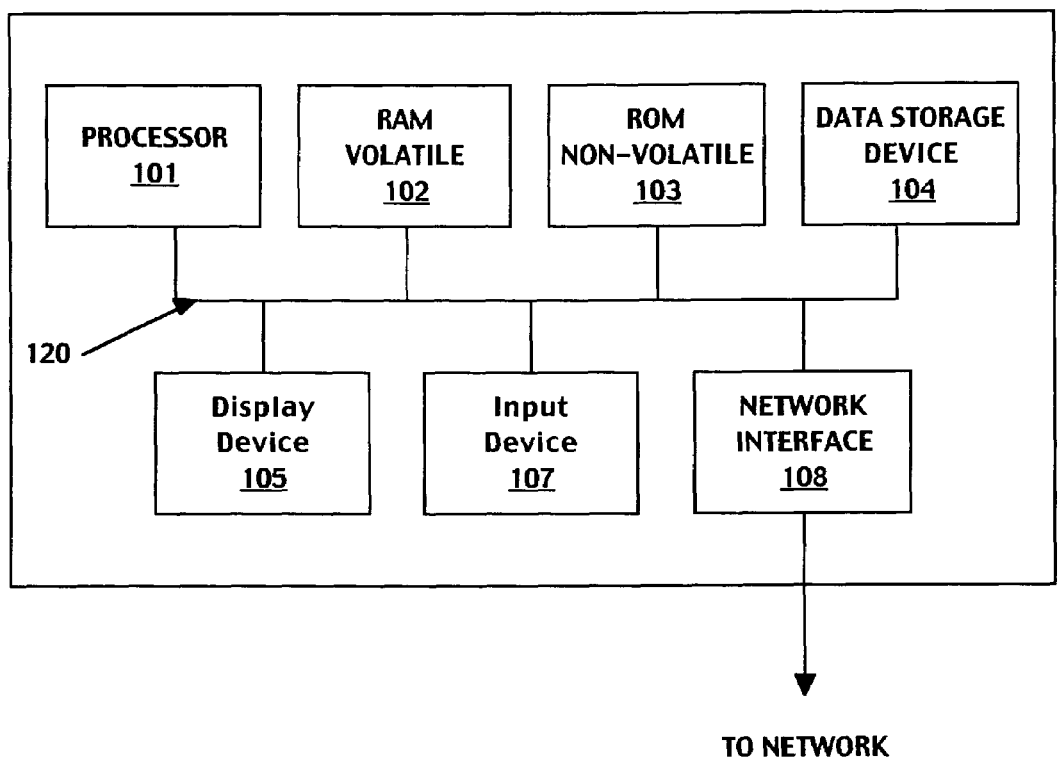
FIG. 1 is a logical block diagram of a computer system capable of performing multisite testing on a plurality of devices under test (DUTs) where simultaneous testing of multiple DUTs includes reconverging test execution sub-paths, in accordance with one embodiment of the present invention.

Reference will now be made in detail to the preferred embodiments of the present invention, a method of automatically determining a testing order of a test flow in a multisite testing environment, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "performing," "branching," "reconverging," "suspending," "determining," and "defining," or the like, refer to the action and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Referring to FIG. 1, embodiments of the present invention are comprised of computer-readable and computer-executable instructions which reside, for example, in computer-readable media of a computer system, such as, automatic testing equipment (ATE), that is capable of prioritizing testing operations in a test flow sequence that tests a plurality of devices under test (DUTs), and simultaneously executing the testing operations in a multisite testing environment. FIG. 1 is a block diagram of exemplary embedded components of such a computer system 100 upon which embodiments of the present invention may be implemented.

Exemplary computer system 100 includes an internal address/data bus 120 for communicating information, a central processor 101 coupled with the bus 120 for processing information and instructions, a volatile memory 102 (e.g., random access memory (RAM), static RAM dynamic RAM, etc.) coupled with the bus 120 for storing information and instructions for the central processor 101, and a non-volatile memory 103 (e.g., read only memory (ROM), programmable ROM, flash memory, EPROM, EEPROM, etc.) coupled to the bus 120 for storing static information and instructions for the processor 101. Computer system 100 may also include various forms of disc storage 104 for storing information.

With reference still to FIG. 1, an optional signal Input/Output device 108 is coupled to bus 120 for providing a communication link between computer system 100 and a network environment. As such, signal Input/Output (I/O) device 108 enables the central processor unit 101 to communicate with or monitor integrated circuits, such as, dice on wafers, that are coupled to the computer system 100. The computer system 100 is coupled to the network (e.g., the testing environment) using the network connection, I/O device 108.

An output mechanism may be provided in order to present information at a display 105 or print output for the computer system 100. Similarly, input devices 107, such as, a keyboard and a mouse may be provided for the input of information to the computer system 100.

Determining a Testing Order of Reconvergence of Test Flow Sequences

Accordingly, various embodiments of the present invention disclose a method and system for reconverging test execution sub-paths in a test flow, thus enabling the simultaneous execution of testing operations in a multisite testing environment. Further, embodiments of the present invention disclose the automatic determination of a testing order of testing operations in the test flow, wherein the test flow includes one or more reconverging test execution sub-paths, or test sequences. Moreover, embodiments of the present invention disclose the assignment of priority values to testing operations in the test flow that tests a plurality of DUTs. Performing the test flow by order of priority assures the execution of each of the testing operations only once when simultaneously performing multisite testing, thus leading to efficient use of shared resources in a multisite testing environment.

Figure 2:
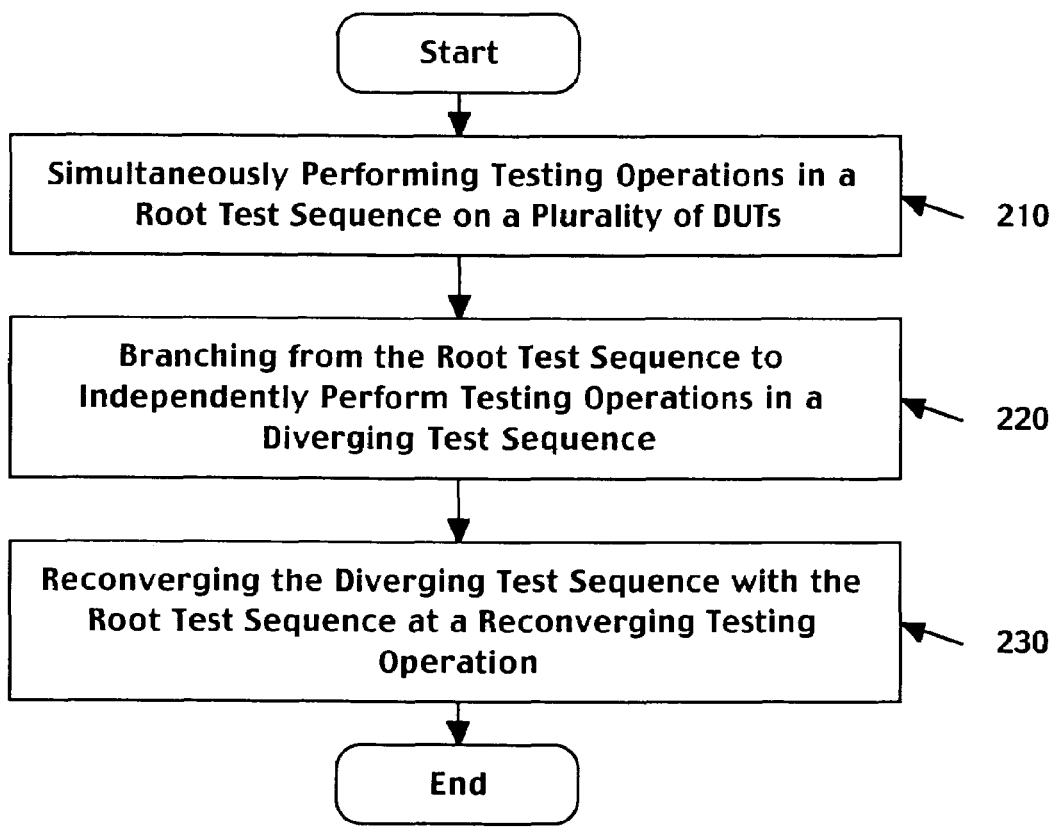
FIG. 2 is a flow chart illustrating steps in a computerized method for simultaneous performance of multisite testing wherein a test execution sub-path includes a sub-path sequence that reconverges back into a root execution sub-path sequence, in accordance with one embodiment of the present invention.

FIG. 2 is a flow chart 200 illustrating steps in a method for reconverging test sequences in a test flow that tests a plurality of DUTs in a multisite testing environment, in accordance with one embodiment of the present invention. The test flow is comprised of discrete testing operations that test for characteristics of the plurality of DUTs. For example, the testing operations may comprise any number of tests, including the following: a continuity test to test electrical continuity; a current flow test to check the amount of current flowing through the device; a voltage test to check voltage swing; various functional tests that check responses to stimulus, etc. The simultaneous performance of testing operations on the plurality of DUTs assures an efficient use of shared resources when performing multisite testing.

Further, the test flow comprises a root test sequence and one or more diverging test sequences. The diverging test sequences diverge from the root test sequence. Resultant test sequences are determined by the testing operations executed on a particular DUT when testing the DUT.

In some embodiments, at least one of the diverging test sequences reconverges with the root test sequence. In some testing of DUTs (e.g., integrated circuits) it is desirable to include reconverging test sequences in the test flow. In that case, there may be numerous testing operations that occur after the reconverging test sequence reconverges. Implementing multisite testing after reconvergence makes efficient use of testing resources, as opposed to a single test sequence, as in the prior art. In this case, the multisite testing environment would execute common testing operations on the DUTs even though the DUTs are tested under different resultant test sequences.

The present embodiment begins by simultaneously performing testing operations in a root test sequence on a plurality of DUTs, in step 210. The root test sequence is comprised of one or more testing operations. In one embodiment, the root test sequence illustrates the shortest successful path through a test flow representing the testing of the plurality of DUTs.

Each of the plurality of DUTs is similar in construction and is designed to have similar characteristics. For example, the plurality of DUTs can be integrated circuits in the form of dice on a wafer, or can be packaged semiconductor devices.

At step 220, the present embodiment branches from the root test sequence to independently perform testing operations in a diverging test sequence. These testing operations in the diverging test sequence are not common with testing operations in the root test sequence. The node representing the branch in the test flow is referred to as the branch node and is represented by the diverging testing operation. Diverging test sequences test those DUTs that fail the testing operation at the branch node from which the diverging test sequence diverges from the root test sequence.

As stated previously, a test flow may comprise multiple diverging test sequences that diverge from a root test sequence in order to test other characteristics of the DUTs. For example, one diverging test sequence may test DUTs for operation at a higher frequency than another diverging test sequence that tests DUTs for operation at a lower frequency. Also, some of these diverging test sequences may remerge with the root test sequence at merge nodes.

During execution of the diverging test sequence, the present embodiment suspends execution of testing operations in the root test sequence. Execution of testing operations in the root test sequence resumes after the execution of the diverging test sequence completes.

In one instance, the diverging test sequence reconverges with the root test sequence at a reconverging testing operation, at 230. As such, when the diverging test sequence reconverges with the root test sequence, all applicable DUTs in the plurality of DUTs are again in a position for simultaneous testing. That is, simultaneous execution of testing operations in the root test sequence can continue to be simultaneously performed on those DUTs that pass the diverging test sequence, and other DUTs that reach the reconverging testing operation (e.g., those DUTs that skip the diverging test sequence).

Figure 5A:
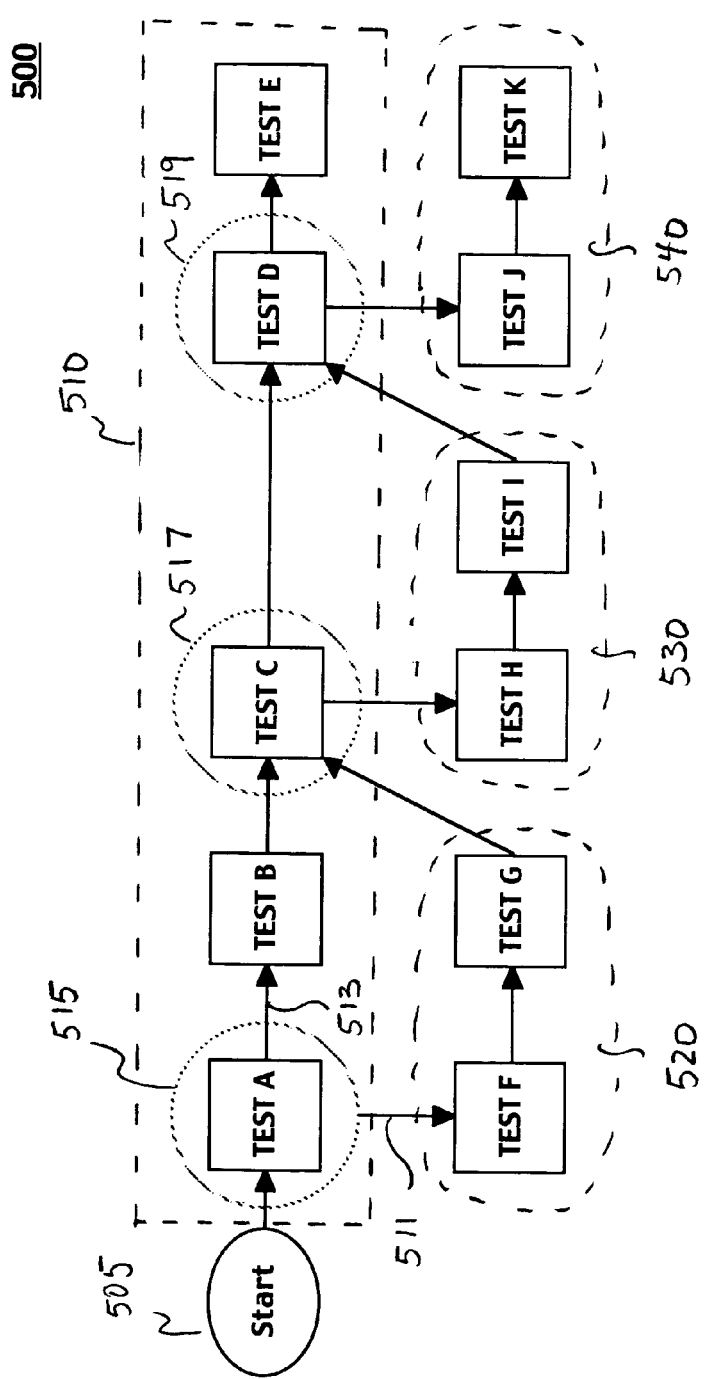
FIG. 5A is a diagram illustrating a test flow for determining an order of priority of testing operations in the test sequence, in accordance with one embodiment of the present invention.

For example, the root test sequence may comprise testing operations that lie between the branch node and the merge node. As illustrated in FIG. 5A, the testing operation represented by TEST B lies between node 515, a branch node, and node 517, a merge node. TEST B is executed on the second subset of DUTs independently of the execution of the diverging test flow sequence 520. Those DUTs from the second subset of DUTs that pass TEST B move on to TEST C.

The resulting test sequence that defines which testing operations are executed on a particular DUT will determine the characteristics of the DUT. As such, the present embodiment labels a tested DUT in the plurality of DUTs depending on which testing operations were executed on the DUT.

Referring now to FIG. 5A, a diagram illustrating a test flow 500 that is used to test a plurality of DUTs in a multisite testing environment is shown, in accordance with one embodiment of the present invention. The test flow comprises a plurality of testing operations, as follows: TEST A, TEST B, TEST C, TEST D, TEST E, TEST F, TEST G, TEST H, TEST I, TEST J, and TEST K. Each of the testing operations may test a specific characteristic, or a group of characteristics, pertaining to the tested DUTs. The arc to the right of the testing operations represents a passing arc. The arc to the bottom of the testing operations represents a failing arc. An arc that is not shown results in termination.

As an illustration of the method of FIG. 2, in one embodiment, the root test sequence 510 of the test flow 500 is comprised of the following testing operations: TEST A, TEST B, TEST C, TEST D, and TEST E. The root test sequence illustrates the shortest successful path through the test flow, in one embodiment. For example, DUTs passing through the root test sequence may be characterized as operating at the highest frequencies for a plurality of DUTs tested under the test flow.

Further, the test flow 500 also illustrates diverging test sequences, in accordance with one embodiment of the present invention. For example, diverging test sequence 520 comprises testing operations TEST F and TEST G. The diverging test sequence 520 branches from the root test sequence from node 515, a branch node, represented by the TEST A. The diverging test sequence 520 reconverges with the root test sequence 510 at node 517, a merge node, represented by the reconverging testing operation, TEST C. Similarly, the diverging test sequence 530 comprises TEST H and TEST I. The diverging test sequence 530 branches from the root test sequence 510 at node 517, a branch node, represented by the diverging testing operation, TEST C, and reconverges with the root test sequence 510 at node 519, a merge node, represented by the reconverging testing operation, TEST D. As shown, some nodes may be both a merge node and a branch node.

The test flow 500 also discloses a diverging test sequence 540 that does not reconverge back with the root test sequence 510. The diverging test sequence 540 comprises TEST J and TEST K and branches from the root test sequence at node 519, a branch node. However, the diverging test sequence 540 ends without reconverging with the root test sequence. A DUT that ends its resultant test sequence at TEST K has different operating characteristics than a DUT that goes through the test flow 500 via the root test sequence 510.

Figure 5B:
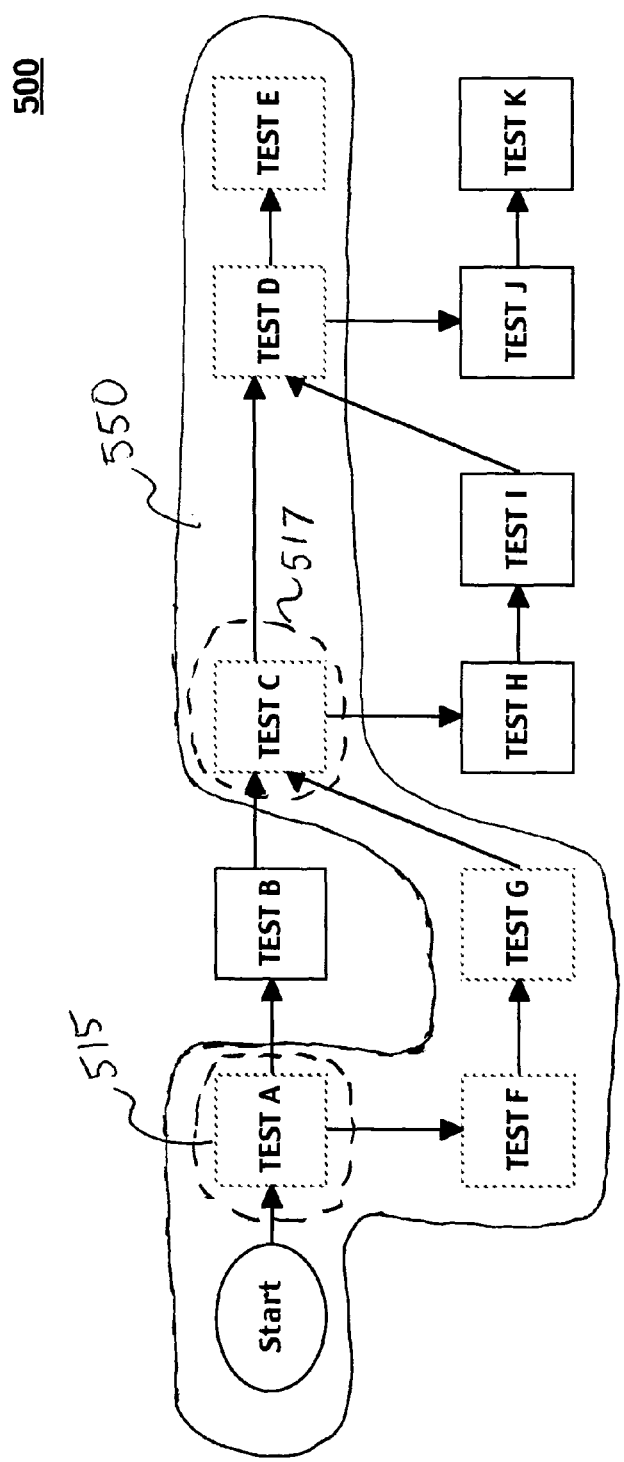
FIG. 5B is a diagram of the test flow of FIG. 5A illustrating a diverging test execution sub-path, in accordance with one embodiment of the present invention.

FIG. 5B is a diagram of the test flow 500 of FIG. 5A that illustrates a resulting test sequence 550 that diverges from the root test sequence 510. As can be seen in test flow 500, numerous other resulting test sequences can be defined depending on which testing operations are selected for execution.

In the test flow 500, a plurality of resultant test sequences are defined depending on which test operations are executed and in what order. In one embodiment, the plurality of resultant test sequences all originate from one node, for example, the start node 505. As an illustration, referring now back to FIG. 5A, a root test sequence 510 originating from the start node 505 is comprised of the following testing operations: TEST A, TEST B, TEST C, TEST D, and TEST E. Now referring to FIG. 5B, a diverging test sequence 550 also originates from the start node 505. The diverging test sequence branches and reconverges with the root test sequence 510, and is comprised of the following testing operations: TEST A, TEST F, TEST G, TEST C, TEST D, and TEST E.

Figure 3:
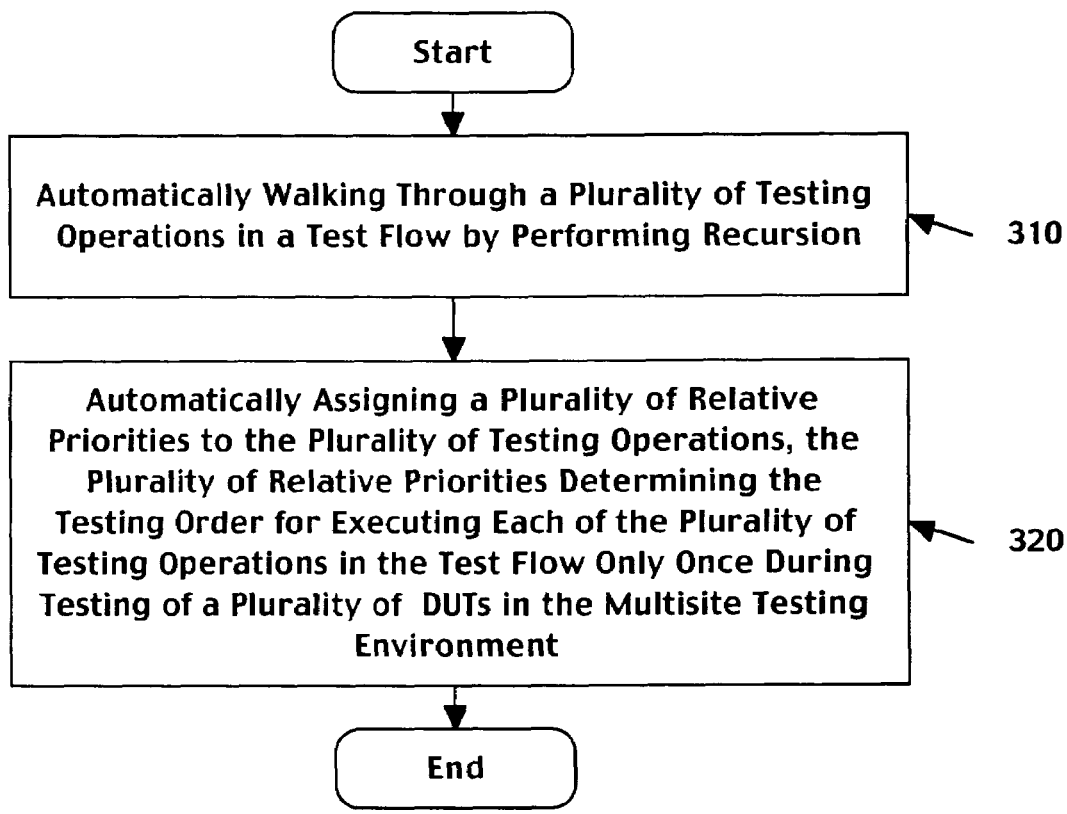
FIG. 3 is a flow chart illustrating steps in a computerized method for determining a testing order of testing operations in a test flow when testing DUTs in a multisite testing environment, in accordance with one embodiment of the present invention.

Now referring to FIG. 3, a flow chart 300 illustrates steps in a computer implemented method for determining a testing order in a test flow, in accordance with one embodiment of the present invention. The testing order, which determines execution priority for the plurality of testing operations in the test flow, is automatically determined. The order of priority for the testing operations is designed such that each of the testing operations is executed once during testing of the plurality of DUTs in the multisite testing environment.

The present embodiment begins by automatically walking through a plurality of testing operations in a test flow, at 310. The plurality of testing operations is walked recursively, or in other words, by performing recursion. Recursion is the ability for the method as described in flow chart 300 to call itself during execution. Implementation of recursion in flow chart 300 is described more fully in the discussion of FIG. 4.

At 320, the present embodiment continues by automatically assigning a plurality of relative priorities to the plurality of testing operations. The plurality of relative priorities determines the testing order for executing each of the plurality of testing operations in the test flow during testing of a plurality of DUTs in a multisite testing environment. Each of the plurality of testing operations is executed once during testing of the plurality of DUTs.

In one embodiment, the test flow comprises a root test sequence, and at least one reconverging test sequence. The method as disclosed in flow chart 300 is capable of acknowledging and recognizing each of the remerge points in the one or more reconverging test sequences when determining the testing order. That is, the process of recursion used when walking through the test flow is capable of recognizing and accounting for the remerge points when the reconverging test sequence remerges with the root test sequence.

In another embodiment, a plurality of DUTs is tested in a multisite testing environment by executing the test flow using the testing order. In other words, the test flow is simultaneously performed on the plurality of DUTs, wherein each of the plurality of testing operations in the test flow is executed by priority as determined by the testing order.

Figure 4:
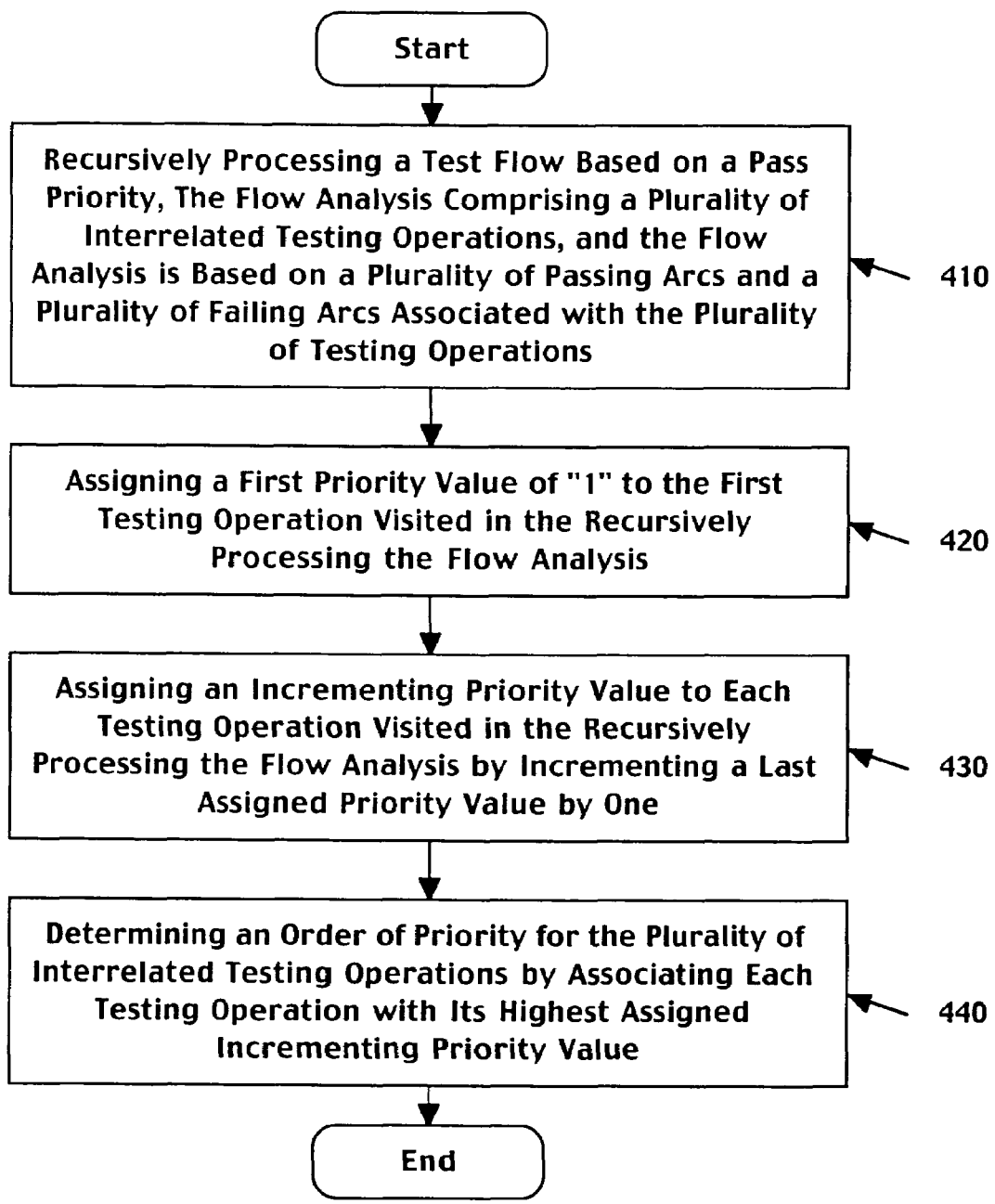
FIG. 4 is a flow chart illustrating steps in a computerized method for determining an order of priority of testing operations in a test flow that tests a plurality of devices, in accordance with one embodiment of the present invention.

FIG. 4 is a flow chart 400 illustrating steps in a method for prioritizing testing operations for use in a multisite testing environment, in accordance with one embodiment of the present invention. The testing operations comprise a test flow that is used to test a plurality of DUTs in the multisite testing environment.

The present embodiment determines a testing order that determines the execution priority of a plurality of testing operations of a test flow. The testing order is established such that each of the plurality of testing operations is executed only once during testing of the plurality of DUTs. The assigning of priorities to the testing operations in the test flow can be performed once before execution of the test flow on the plurality of DUTs. These priorities remain constant as long as the test flow remains the same. Different sets of priority values are necessary for different test flows.

The present embodiment begins by recursively processing, or recursively walking through, the test flow based on a pass priority, at 410. The test flow comprises a plurality of testing operations, as previously described in full. By way of illustration only, the test flow 500 of FIGS. 5A, 5B, 5C, and 5D shows an exemplary plurality of testing operations.

In another embodiment, the recursively walking through the test flow is based on a fail priority. In that case, the method of prioritizing testing operations begins by recursively walking through the test flow based on a fail priority, and walks failing arcs first before walking passing arcs.

The test flow is based on a plurality of passing arcs and a plurality of failing arcs associated with the plurality of testing operations. Each of the testing operations in the test flow is a discrete test for analyzing characteristics of the plurality of DUTs, as described in full previously. Each DUT in the plurality of DUTs can either pass or fail a specific testing operation.

As such, the testing operations in the test flow are associated with passing arcs and failing arcs. For example, referring back to FIG. 5A, the node 515 comprises both a passing arc 513 and a failing arc 511. Those DUTs passing the testing operation, TEST A, at node 515 proceed along passing arc 513. Correspondingly, those DUTs failing the testing operation, TEST A, at node 515 proceed along failing arc 511.

When recursively walking through the test flow, the present embodiment begins at the start node and follows the passing arc. For example, in FIG. 5A, recursively walking through the test flow 500 begins at start node 505 and walks to node 515. Because of the pass priority, the present embodiment identifies the passing arc 513 associated with node 515 and recursively walks the passing arc 513. In recursion, the present embodiment walks the passing arc 513 from TEST A and returns later to walk the diverging test sequence that begins by recursively walking through the failing arc 511 from TEST A.

The present embodiment implements an inverse priority. In this case, the lower the priority value, the higher its priority in the testing order that determines the priority of execution of the testing operations in the test sequence. A single counter is implemented for assigning priority values to the testing operations in the test flow 500. The counter begins with a value of "n." In one embodiment, the value of "n" is equal to "1" and represents the highest priority.

The present embodiment assigns a first priority value of "1" to the first testing operation visited when recursively walking through the test flow, at 420. As such, TEST A is initially assigned a priority value of "1."

At 430, the present embodiment then assigns an incrementing priority value to each testing operation visited when recursively walking through the test flow. The priority value assigned is determined by incrementing the last assigned priority value by one. The last assigned priority value can be stored in the counter in memory, in one embodiment.

A particular testing operation in the test flow may be assigned more than one priority value. This is possible since the testing operation may be visited numerous times when recursively walking through the test flow.

As the first node is walked, the present embodiment recursively enters the next testing operation through a passing arc and successive testing operations through successive passing arcs until all the passing arcs have been walked. Incrementing priority values will be assigned to each testing operation visited in the order that they are visited. Once the end is reached where there are no successive testing operations that can be reached through a passing arc, the recursive feature of the present embodiment returns to the last branching testing operation, and recursively walks the failing arc of the branching testing operation using a pass priority again. As such, the next testing operation called would be identified by the failing arc of the branching testing operation.

As a result, any testing operation that represents a merging node will be visited two or more times depending on how many branching nodes precede the merge node. The first visit will be following a passing arc of a branching node preceding the merge node. The second visit will be following a failing arc of the branch node. The second visit to the merge node will be assigned a higher priority value. This indicates that run time execution of the testing operation of the merge node should not proceed until there are no remaining sites on any test sequence leading to the merge node.

At 440, the present embodiment determines an order of priority for the plurality of interrelated testing operations by associating each testing operation with its highest assigned priority value. For example, if a particular testing operation is visited twice, and has been assigned priority values of "10" and "20", the priority value of "20" would be its highest assigned priority value that would be associated with the particular testing operation.

Table 1 outlined below lists an exemplary pseudo code for implementing the assignment of priority values to testing operations in a test flow that is used for testing a plurality of DUTs in a multisite testing environment, as follows:

TABLE 1

```
Walk(FlowNode& the_node)
{
    static int next_priority=1;
    if the node does not exist, then return.
    the_node.inverse_priority = next_priority++;
    Walk(the node indicated by the_node's passing
        arc);
    Walk(the node indicated by the_node's failing
        arc);
}
```

Figure 5C:
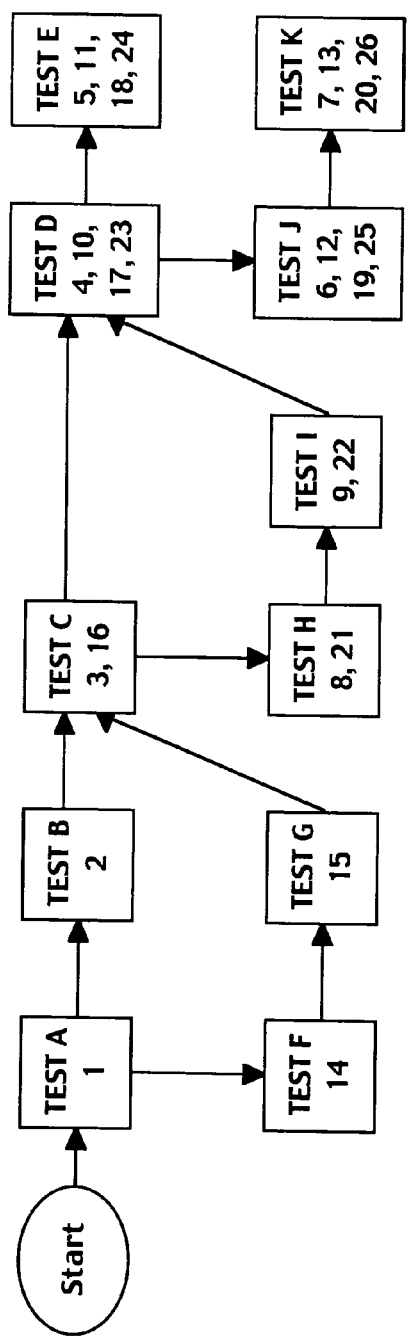
FIG. 5C is a diagram of the test flow of FIG. 5A illustrating the assignment of priority values to the testing operations of the test flow, in accordance with one embodiment of the present invention.

Referring now to FIG. 5C, a diagram illustrating the test flow 500 of FIG. 5A is shown in which priority values are assigned as each testing operation is visited when recursively walking the test flow 500, in accordance with one embodiment. The testing operations are visited in the order indicated in the blocks representing the testing operations. These values are also the values used to determine the assigned priority values in the testing order that are associated with each testing operation for use in multisite testing.

For example, when recursively walking through the test flow 500 using a pass priority, the present embodiment begins at TEST A, as denoted by the value of "1" assigned to TEST A. By following the passing arc, the next testing operation visited is TEST B, as denoted by the value of "2" assigned to TEST B. Since successive passing arcs are recursively entered, the present embodiment visits and assigns initial priority values to testing operations in the following order, until reaching the end after TEST E, as follows: TEST C:3, TEST D:4, and TEST E:5.

After reaching the end after TEST E, the present embodiment returns to the last branching testing operation at TEST D, and recursively walks the failing arc. As a result, the present embodiment follows the failing arc to TEST J as denoted by the value of "6" assigned to TEST J. Since the present embodiment still follows the pass priority, a passing arc is first followed from TEST J to TEST K, as indicated by the value of "7" assigned to TEST K.

Again, the present embodiment has reached an end or termination. The present embodiment returns to the last branching testing operation that has not followed both its passing arc and failing arc to complete the recursive walk through the test flow 500. As such, the present embodiment returns not to TEST D, since both the passing and failing arcs for TEST D have been recursively walked, but to TEST C. From TEST C, the present embodiment recursively walks the failing arc to TEST H in a diverging test sequence, as denoted by the value of "8" assigned to the testing operation. From TEST H, the present embodiment follows the passing arc to TEST I, as denoted by the value of "9" assigned to the testing operation.

From TEST I, the diverging testing operation reconverges back with the root test sequence at TEST D, by following the passing arc from TEST I. As shown, TEST D had been previously visited. However, the present embodiment again assigns a priority value to TEST D of "10." From TEST D, the present embodiment again recursively walks the passing and failing arcs following a pass priority.

This process is continued until all the resultant test sequences of the test flow has been recursively walked, in accordance with one embodiment of the present invention.

In one embodiment, loops in the test flow are identified. Loops in the test flow may induce an infinite recursion when recursively walking the test flow sequence. As such, the present embodiment recognizes the loop and breaks the infinite recursion. For example, the present embodiment assigns a level number that indicates the minimum path length from the start node to that testing operation in a given test flow sequence. Loops, once identified, are broken when branching from higher level numbered testing operations back to a lower level numbered testing operation. In this case, the arc is ignored when the loop is broken.

Figure 5D:
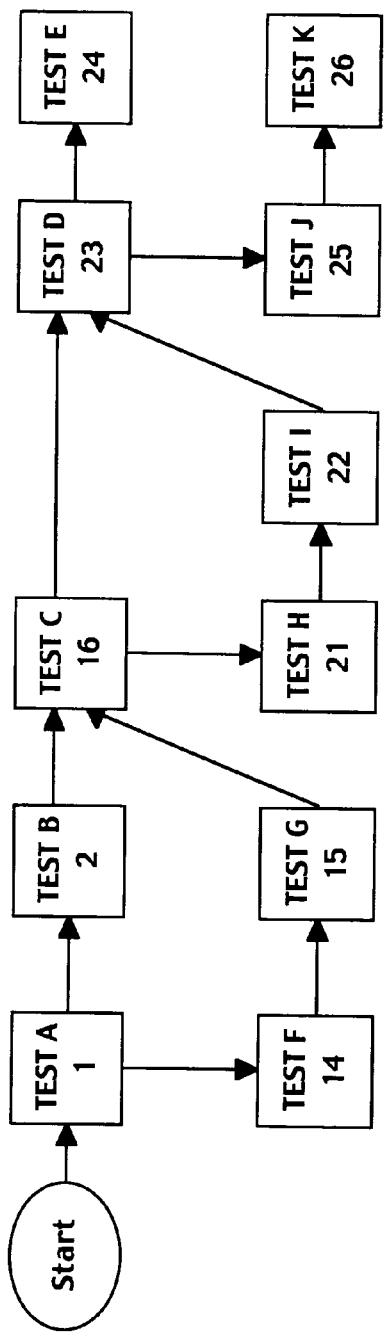
FIG. 5D is a diagram of the test flow of FIG. 5A illustrating the assignment of priority values to the testing operations of the test flow for use when performing multisite testing of a plurality of devices, in accordance with one embodiment of the present invention.

FIG. 5D is a diagram of the test flow 500, as also shown in FIGS. 5A–5C, illustrating the association of the highest assigned priority value to each of the testing operations. Once the test flow 500 has completed its recursive walk, the present embodiment associates the highest assigned priority value for each testing operation. In this case, each testing operation is associated with its lowest priority when determining the order of execution of the testing operations in the test flow. The priority values may not be continuous through each of the testing operations, and there can be numbers that are not used at any testing operation. However, the present embodiment only compares whether one priority value is larger than another priority value to determine the order of priority between the two testing operations.

As a result, the list of testing operations, by order of priority, starting with the testing operation having the highest priority, for the test flow of FIG. 5D is as follows: TEST A, TEST B, TEST F, TEST G, TEST C, TEST H, TEST I, TEST D, TEST E, TEST, J, and TEST K. By following the testing order at run-time when executing the test flow, the present embodiment ensures that all the merge nodes are identified and given the proper priority so that all the testing operations are executed only once. This helps to ensure that shared resources in a multisite testing environment are used simultaneously when testing common testing operations for varying test sequences.

Figure 6:
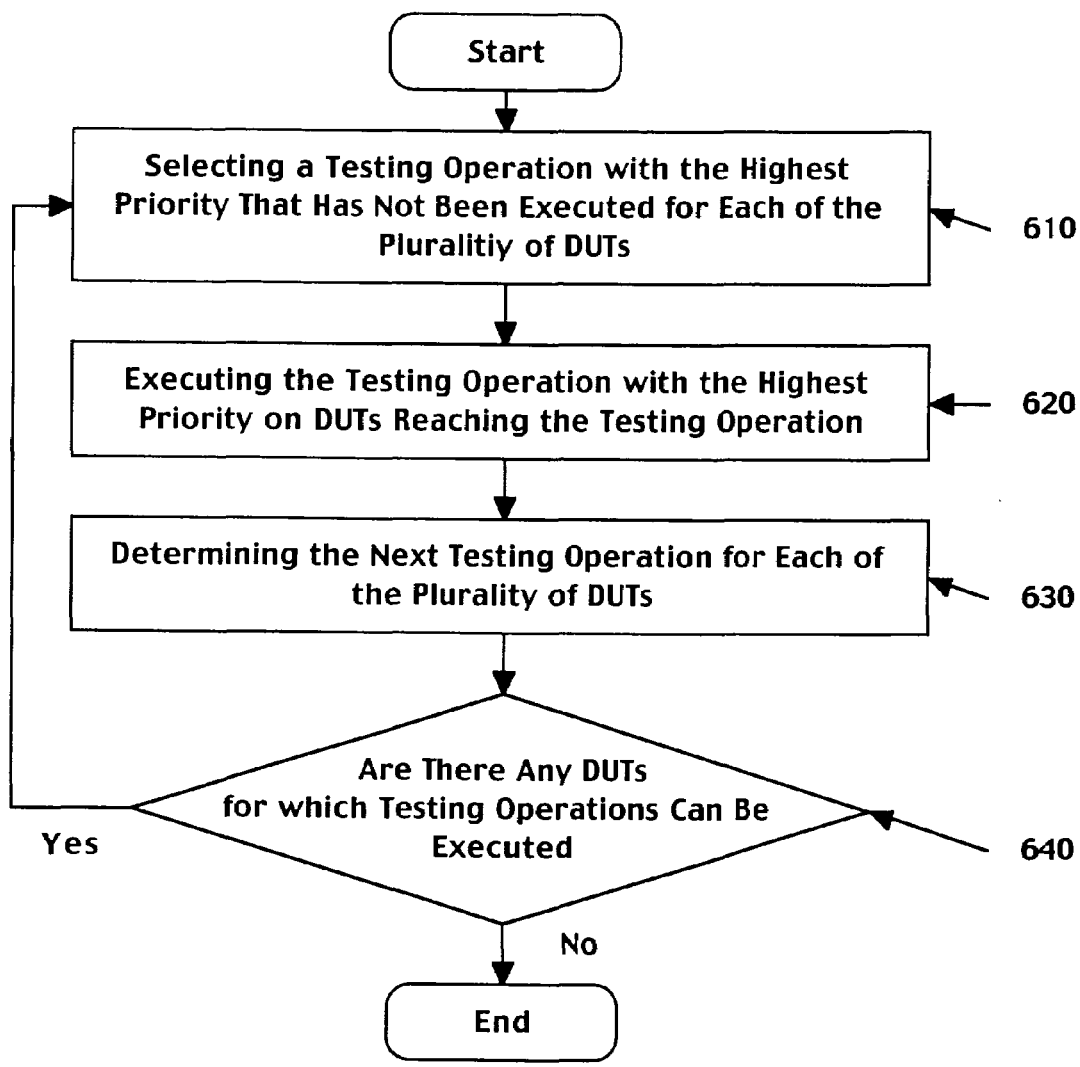
FIG. 6 is a flow diagram illustrating steps in a computerized method for executing testing operations by order of priority in a multisite testing environment, in accordance with one embodiment of the present invention.

FIG. 6 is a flow chart 600 illustrating steps in a method for executing testing operations of a test flow simultaneously on a plurality of DUTs in a multisite testing environment, in accordance with one embodiment of the present invention. In general, execution of the plurality of testing operations in the test flow proceeds by selecting the testing operation with the highest priority in the test flow. The testing operation with the highest priority is associated with the lowest priority value, in one embodiment.

As branching occurs during the multisite testing, different DUTs at different sites become ready to run at different flow nodes representing different testing operations. The present embodiment determines when to execute each of the testing operations of the test flow during a test of a plurality of DUTs.

At step 610, the present embodiment selects the testing operation with the highest priority that has not been executed for each of the plurality of DUTs. As stated previously, selection of the testing operation is accomplished by order of priority in the testing order. At any particular time during testing, each DUT is associated with a testing operation to be executed on the DUT, or the DUT has terminated the test. These testing operations are assigned priority values.

As such, at step 620, the present embodiment executes the testing operation on the plurality of DUTs with the highest priority. Testing occurs for all DUTs at sites in the multisite testing environment that are at the selected testing operation having the highest priority.

At step 630, the present embodiment determines the next node, or testing operation, for execution. Selection of the next node is based on its pass or fail result from the execution of the testing operation in step 620, and following the arc established by the passing or failing result.

Next, the present embodiment then determines if there are any DUTs left for which testing operations can be executed in the test flow used to test the plurality of DUTs, in decision step 640. If there are DUTs to be tested, then the present embodiment returns to step 610 to select the testing operations with the highest priority to be executed on the plurality of DUTs. However, once all the DUTs have executed all their associated testing operations, then the present embodiment ends. By assigning an order of priority, the present embodiment allows for the simultaneous testing of a plurality of DUTs in a multisite testing environment where testing operations are executed only once during testing.

For purposes of illustration only, Table 2 shows a possible scenario for performing multisite testing using the test flow 500 of FIGS. 5A–5D, in accordance with one embodiment. The test flow 500 is executed on a plurality of DUTs numbered 1–8. The "Test" block indicates the testing operation that is being executed at any time during multisite testing of a plurality of DUTs. The "Current Test Result" block indicates pass and fail results for the testing operation executed. The "Next Test" block indicates the next testing operation to be executed for each of the DUTs in the test flow depending on their pass/fail result. The "Flow Node Priorities" block indicates the priorities for the next testing operation for each of the plurality of DUTs. A blank space indicates that the testing operation was not executed on that particular DUT. An "x" indicates that the DUT has terminated the test.

TABLE 2

| Test | \multicolumn{8}{c}{Current Test Result (Test Location)} | | | | | | | | \multicolumn{8}{c}{Next Test (Test Location)} | | | | | | | | Flow Node Priorities |
|---|---|---|---|---|---|---|---|---|---|---|---|---|---|---|---|---|---|

| Test | 1 | 2 | 3 | 4 | 5 | 6 | 7 | 8 | 1 | 2 | 3 | 4 | 5 | 6 | 7 | 8 | Priorities |
|---|---|---|---|---|---|---|---|---|---|---|---|---|---|---|---|---|---|
| Test A | p | p | p | p | f | f | f | f | B | B | B | B | F | F | F | F | Test B = 2<br>Test F = 14 |
| Test B | p | p | p | f |   |   |   |   | C | C | C | x | F | F | F | F | Test F = 14<br>Test C = 16 |
| Test F |   |   |   |   | p | p | p | f | C | C | C | x | G | G | G | x | Test G = 15<br>Test C = 16 |
| Test G |   |   |   |   | p | p | p |   | C | C | C | x | C | C | x | x | Test C = 16 |
| Test C | p | p | p |   | p | f |   |   | D | D | D | x | D | H | x | x | Test H = 21<br>Test D = 23 |
| Test H |   |   |   |   |   | f |   |   | D | D | D | x | D | x | x | x | Test D = 23 |
| Test D | p | f | p |   | p |   |   |   | E | J | E | x | E | x | x | x | Test E = 24<br>Test J = 25 |
| Test E | p |   | p |   | f |   |   |   | x | J | x | x | x | x | x | x | Test J = 25 |
| Test J |   | p |   |   |   |   |   |   | x | K | x | x | x | x | x | x | Test K = 26 |
| Test K |   | p |   |   |   |   |   |   | x | x | x | x | x | x | x | x | None |

By way of illustration, the present embodiment begins at the testing operation with the highest priority, TEST A. Eight DUTs are being tested by the test flow in the multisite testing environment. After executing TEST A, four DUTs pass (DUTs 1–4), and four DUTs fail (DUTs 5–8). Based on the pass/fail result, the next test for DUTs 1–4 is TEST B, which has a priority value of "2," as determined from the test flow 500 of FIG. 5D. Similarly, the next test for DUTs 5–8 is TEST F, which has a priority value of "14."

The present embodiment selects TEST B because it has a higher priority over TEST F. As a result, the next test to be executed for each of the plurality of DUTs is TEST B. As shown in Table 1, TEST B is executed on DUTs 1–4 only, since these are the only DUTs that are in a position for TEST B to be executed. DUTs 5–8 are in position for TEST F to be executed. This process continues until all the DUTs have executed their testing operations depending on which test sequences were followed.

Figure 7:
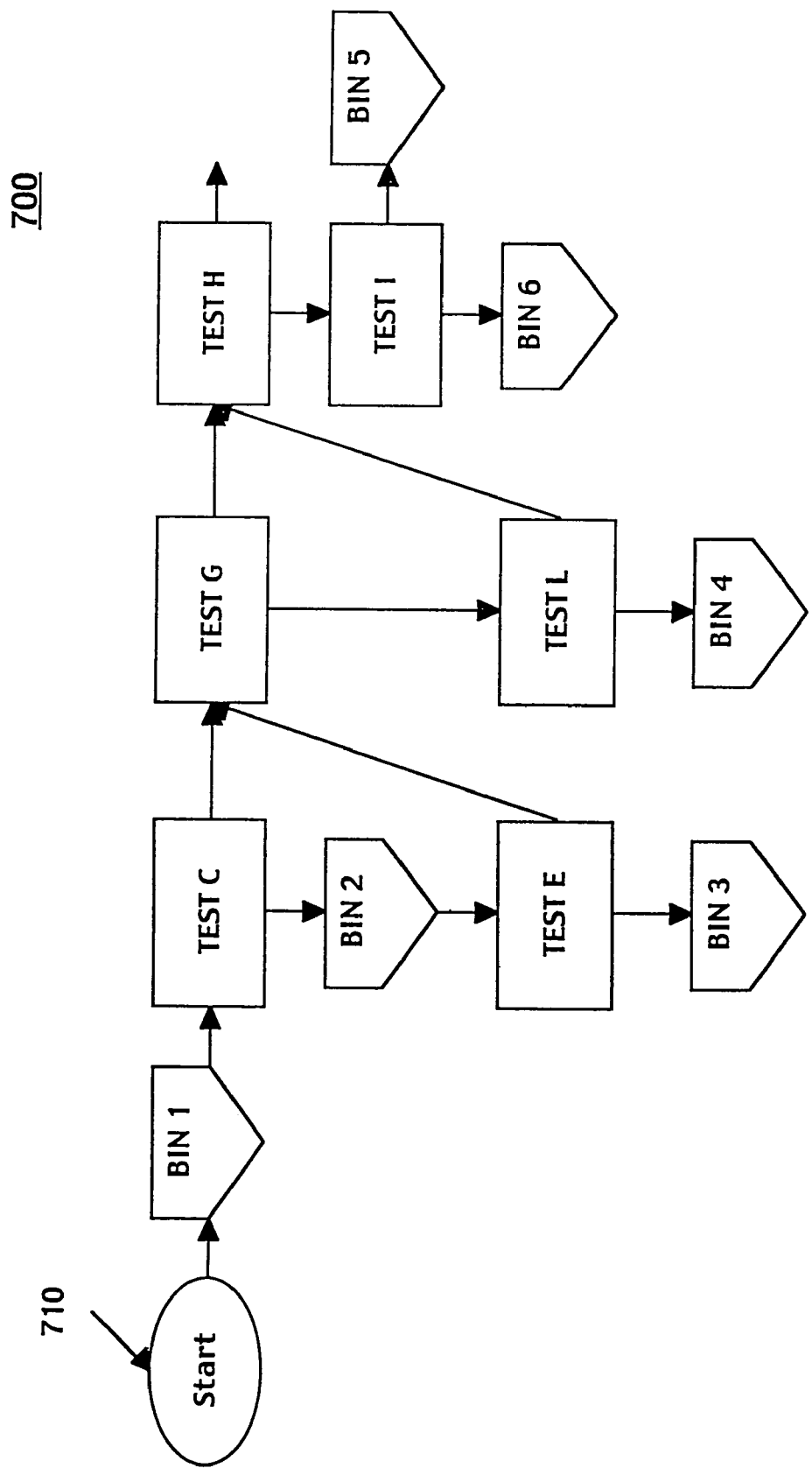
FIG. 7 is a diagram illustrating a test flow for determining an order of priority of testing operations in the test flow that also shows the categorization or labeling of devices, in accordance with one embodiment of the present invention.

FIG. 7 is a diagram of a test flow 700 that illustrates the labeling of DUTs after testing is complete, in accordance with one embodiment of the present invention. The test flow 700 is comprised of a start node 710. Test flow 700 is also comprised of the following testing operations: TEST C, TEST E, TEST G, TEST H, TEST I, and TEST L. The test flow 700 also comprises the following bins: BIN 1, BIN 2, BIN 3, BIN 4, BIN 5, and BIN 6.

As an option, there is not a bin defined after the testing operation TEST H. In this case, when exiting the test flow after TEST H, the present embodiment requires that a BIN be defined somewhere in the test flow.

Priority values can also be determined for the flow blocks corresponding to the start node, the testing operations, and the bins in the test flow 700. The priority values are not shown. The priority values are determined using the methods outlined in flow charts 200, 300, 400, and 600, as described previously in full.

The DUTs are assigned to particular bins depending on which resultant test sequence is executed on the particular DUT. In one embodiment, the DUTs are assigned to the bin last encountered when executing steps in a sequence of the test flow 700. For example, for a DUT that exits the test flow 700 after TEST H may have gone through various test sequences. If the DUT follows the root test sequence of TEST C, TEST G, and TEST H, then the DUT is assigned to BIN 1. However, if the DUT follows the divergent test sequence of TEST C, TEST E, TEST G, and then TEST H, then the DUT is assigned to BIN 2. Also, as another example, if the DUT follows the divergent test sequence partly comprising TEST G, TEST L, and then TEST H, then the DUT is assigned back to BIN 1, or possibly BIN 2 depending on the path taken. This may be the case when a DUT fails a particular testing operation initially, but still can be categorized with the DUTs that pass the particular testing operation, if that DUT can pass further testing operations in a diverging test sequence.

Moreover, each of the steps in the flow charts of FIGS. 2, 3, 4, and 6 are executed automatically, in accordance with one embodiment of the present invention. As such, by inputting the test flow into a multisite testing device, appropriate priority values are assigned to the testing operations in the test flow to be used during simultaneous testing of the testing operations on a plurality of DUTs.

While the methods of embodiments illustrated in flow charts 200, 300, 400, and 600 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a method and system for determining a testing order of testing operations in a test flow, thus enabling the more efficient execution of testing operations in a multisite testing environment, have been described. Moreover, embodiments of the present invention disclose the assignment of priority values to testing operations in a test flow for use to test a plurality of DUTs in a multisite testing environment. While the present invention has been described in particular embodiments, it should be appreciated that the present invention should not be construed as limited by such embodiments, but rather construed according to the below claims.

What is claimed is:

1. A method of determining a testing order in a multisite testing environment, comprising:

automatically walking through a plurality of testing operations in a test flow by performing recursion; and automatically assigning a plurality of relative priorities to said plurality of testing operations, said plurality of relative priorities determining said testing order for executing each of said plurality of testing operations in said test flow only once during testing of a plurality of devices under test (DUTs) in said multisite testing environment.

2. The method of claim 1, wherein said automatically assigning said plurality of relative priorities comprises:
assigning a first priority value of "n" to the first testing operation visited when performing said recursion;
assigning an incrementing priority value to each testing operation visited when performing said recursion by incrementing a last assigned priority value; and
determining said testing order by associating each testing operation with its highest assigned priority value.

3. The method of claim 1, wherein said automatically assigning further comprises:
assigning said plurality of relative priorities in an inverse priority fashion, wherein a first testing operation assigned a lower priority is executed before a second testing assigned a higher priority.

4. The method of claim 1, further comprising:
simultaneously performing said test flow following said testing order on a plurality of DUTs.

5. The method of claim 4, further comprising:
simultaneously performing a first set of testing operations in a root test sequence on said plurality of DUTs;
branching from said root test sequence to independently perform a second set of testing operations in a diverging test sequence on a first subset of said plurality of DUTs; and
reconverging said diverging test sequence with said root test sequence at a first remerge point.

6. The method of claim 1, wherein said automatically walking further comprises:
automatically recognizing at least one remerge point in said test flow when performing said recursion.

7. The method of claim 1, wherein each of said plurality of DUTs comprises an integrated circuit (IC) chip.

8. A method of prioritizing testing operations for use in a multisite testing environment, comprising:
a) recursively processing a test flow based on a pass priority, said test flow comprising a plurality of interrelated testing operations, said test flow based on a plurality of passing arcs and a plurality of failing arcs associated with said plurality of testing operations;
b) assigning a first priority value of "n" to the first testing operation visited in said recursively processing said test flow; and
c) assigning an incrementing priority value to each testing operation visited in said recursively processing said test flow by incrementing a last assigned priority value;
d) determining an order of priority for said plurality of interrelated testing operations by associating each testing operation with its highest assigned priority value.

9. The method of claim 8, wherein "n" is of value "1."

10. The method of claim 8, wherein said order of priority is based on an inverse priority such that lower priority values have priority over higher priority values.

11. The method of claim 8, further comprising:
e) testing a plurality of devices under test (DUTs) in said multisite testing environment by simultaneously executing said plurality of interrelated testing opera-
tions in said test flow on said plurality of DUTs by said order of priority.

12. The method of claim 11, further comprising:
e1) selecting a testing operation with the highest priority that has not been executed;
e2) executing said testing operation with the highest priority on DUTs reaching said testing operation with the highest priority;
e3) determining the next testing operation for each of said plurality of DUTs; and
e4) returning to e1) unless all possible testing operations have been executed.

13. The method of claim 11, wherein each of said plurality of interrelated testing operations is executed once during said testing of said plurality of DUTs.

14. The method of claim 8, wherein said a) comprises:
a1) following passing arcs in testing operations of said test flow until reaching an end; and
a2) returning to a diverging testing operation having the highest previously assigned priority value to follow a failing arc in testing operations of said test flow sequence, and returning to a1).

15. The method of claim 8, wherein said c) further comprises:
c1) storing said incrementing priority value as said last assigned priority value.

16. The method of claim 8, further comprising:
e) identifying a loop in said test flow;
f) breaking an infinite recursion in said loop; and
g) returning to said recursively processing said test flow based on a pass priority in a).

17. A computer system comprising:
a processor; and
a computer readable memory coupled to said processor and containing program instructions that, when executed, implement a method of determining a testing order in a multisite testing environment, comprising:
automatically walking through a plurality of testing operations in a test flow by performing recursion; and
automatically assigning a plurality of relative priorities to said plurality of testing operations, said plurality of relative priorities determining said testing order for executing each of said plurality of testing operations in said test flow only once during testing of a plurality of devices under test (DUTs) in said multisite testing environment.

18. The computer system of claim 17, wherein said automatically assigning said plurality of relative priorities in said method comprises:
assigning a first priority value of "n" to the first testing operation visited when performing said recursion;
assigning an incrementing priority value to each testing operation visited when performing said recursion by incrementing a last assigned priority value; and
determining said testing order by associating each testing operation with its highest assigned priority value.

19. The computer system of claim 17, wherein said automatically assigning in said method further comprises:
assigning said plurality of relative priorities in an inverse priority fashion, wherein a first testing operation assigned a lower priority is executed before a second testing assigned a higher priority.

20. The computer system of claim 17, wherein said method further comprises:
simultaneously performing said test flow following said testing order on a plurality of DUTs.

21. The computer system of claim 20, wherein said method further comprises:
  simultaneously performing a first set of testing operations in a root test sequence on said plurality of DUTs;
  branching from said root test sequence to independently perform a second set of testing operations in a diverging test sequence on a first subset of said plurality of DUTs; and
  reconverging said diverging test sequence with said root test sequence at a first remerge point.

22. The computer system of claim 17, wherein said automatically walking in said method further comprises:
  automatically recognizing at least one remerge point in said test flow when performing said recursion.

23. The computer system of claim 17, wherein each of said plurality of DUTs comprises an integrated circuit (IC) chip.

* * * * *